(12) United States Patent
Matsui et al.

(10) Patent No.: US 6,213,786 B1
(45) Date of Patent: Apr. 10, 2001

(54) ELECTRONIC DEVICE AND MULTI-PIN CONNECTOR THEREFOR

(75) Inventors: Kiyoshi Matsui; Takayuki Ono, both of Hadano; Kenichi Kasai, Ushiku; Tsutomu Imai, Hadano; Morio Suzuki, Hadano; Hideyuki Fukasawa, Hadano; Mitugu Shirai, Hadano; Toshitaka Murakawa, Hadano; Takeji Siokawa, Kanagawa-ken; Takeshi Kuroda, Hadano, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/632,242

(22) Filed: Aug. 3, 2000

Related U.S. Application Data

(63) Continuation of application No. 09/064,197, filed on Apr. 22, 1998, now Pat. No. 6,132,221, which is a continuation of application No. 08/627,459, filed on Apr. 4, 1996, now Pat. No. 5,743,009.

(30) Foreign Application Priority Data

Apr. 7, 1995 (JP) .................................................. 7-082289
Jun. 28, 1995 (JP) .................................................. 7-162133

(51) Int. Cl.[7] .............................. H01R 12/00; H05R 1/00
(52) U.S. Cl. .............................................. 439/70; 361/784
(58) Field of Search .............................. 439/68, 70, 525, 439/526, 751, 71, 66, 885, 342; 361/784; 174/260; 29/837, 464, 843, 747; 269/903; 206/330

(56) References Cited

U.S. PATENT DOCUMENTS

| 4,787,853 | 11/1988 | Igarashi ................................. 439/55 |
| 4,834,662 | 5/1989 | Schempp et al. ...................... 439/83 |
| 4,998,884 | 3/1991 | Ishikawa et al. ...................... 439/49 |
| 5,215,472 | 6/1993 | DelPrete et al. ....................... 439/71 |
| 5,479,319 | 12/1995 | Werther ................................. 361/784 |
| 5,481,435 | 1/1996 | Werther ................................. 361/784 |
| 5,597,320 | 1/1997 | Wang et al. ........................... 439/342 |
| 5,926,375 | 7/1999 | Watanabe et al. ..................... 361/760 |

FOREIGN PATENT DOCUMENTS

| S54-8870 | 4/1979 | (JP) . |
| 1-95595 | 4/1989 | (JP) . |
| 10-229262 | 8/1998 | (JP) . |

Primary Examiner—Khiem Nguyen
Assistant Examiner—Michael C. Zarroli
(74) Attorney, Agent, or Firm—Mattingly, Stanger & Malur, P.C.

(57) ABSTRACT

A multi-pin connector has contact pins fixedly soldered into bottomed connection holes which are in desired positions on a printed board, so that the contact pins are arrayed in a desired form without a housing. The multi-pin connector can be manufactured in a short period of time and can have any pitch, any number of pins and any shape.

12 Claims, 10 Drawing Sheets

_US 6,213,786 B1_

ELECTRONIC DEVICE AND MULTI-PIN CONNECTOR THEREFOR

This is a continuation application of U.S. Ser. No. 09/064,197, (U.S. Pat. No. 6,132,221) filed on Apr. 22, 1998; which is a continuation application of U.S. Ser. No. 08/627,459, (U.S. Pat. No. 5,743,009) filed Apr. 4, 1996.

BACKGROUND OF THE INVENTION

The present invention relates to a high-density, multi-pin connector for mounting a pin grid array (PGA) LSI package or a multi-chip module (MCM) board on a main board.

The recent market trend for multi-pin connectors is as follows.

(1) Mainly developed in the field of multi-pin connectors manufactured by connector makers are those having contact-pin pitches, numbers of pins, etc. which are common to boards generally used.

As for the pitches, for example, 2.54 mm and 1.27 mm are typical.

(2) With the progress of MCM boards, they are increased both in board size (~□100 mm) and in number of pins (about 1000 to 10000 pins), which involve increasing also the size of multi-pin connectors onto which such MCM boards are mounted.

Meanwhile, a multi-pin connector is manufactured by, for example, press-fitting contact pins in a housing, or by integrally molding with contact pins set in a mold beforehand.

An example of a multi-pin connector, which is commercially available, is shown in FIG. 17. In FIG. 17, a plurality of contacts 101 are formed on an upper surface of a base portion 100 on which a PGA LSI package to be mounted, and a plurality of pins 102 for connection to the contacts are formed on a lower surface of the base portion.

The conventional multi-pin connectors mentioned above give rise to some problems which will be described below.

First, the commercially available multi-pin connectors have limitations in contact-pin pitch and number of pins. Mounting for accommodating the high density and narrow pitch is necessary to improve the performance of electronic devices. However, such commercially available connectors cannot sufficiently bring out the performance of electronic devices.

Secondly, in view of the above, there is a way of developing connectors for particular specifications. However, this would not only require substantial time and investment for the development of such connectors, but also may affect the development schedule of electronic devices using the connectors.

Thirdly, when the board size is increased due to the high density and narrow pitch as is in MCM boards, connectors are limited in connector size, number of pins and pitch because of restrictions imposed on the forming pressure, the narrow-pitch structure, the housing size, etc. in a connector housing forming machine.

SUMMARY OF THE INVENTION

It is an object of the present invention to provide a multi-pin connector which can solve the above problems in the prior art, to be manufactured with ease in a short period of time, and be able to have any pitch and any number of pins.

To achieve the above object, according to the invention, a multi-pin connector is formed with a plurality of contact pins, which are to be connected to input/output pins of a PGA LSI package and/or an MCM board, directly connected to a main board in desired positions.

Further, in the multi-pin connector according to the invention, a guide frame for insertion of an LSI package and/or an MCM board is provided around the outer periphery of the contact pins to improve fitting accuracy between the input/output pins and the contact pins, in view of the increased number of pins and a narrower pitch.

Moreover, for the purpose of protecting the contact pins from external force, dust and so on, a protective cover is provided in a manner of enclosing the upper portions of the contact pins as well as the peripheries of the individual contact pins.

In accordance with the present invention, by arranging and fixing a number of contact pins directly onto a main board in desired positions, a multi-pin connector having any desired pitch and any desired number of pins can be manufactured. It is therefore possible to remarkably shorten the time period for development of connectors and reduce the development cost thereof.

Additionally, since a multi-pin connector having any desired shape can be manufactured, the mounting density of an electronic device can be greatly improved.

DETAILED DESCRIPTION OF THE PREFERRED EMBODIMENTS

Preferred embodiments of the present invention will be now described with reference to the drawings.

Figure 1:
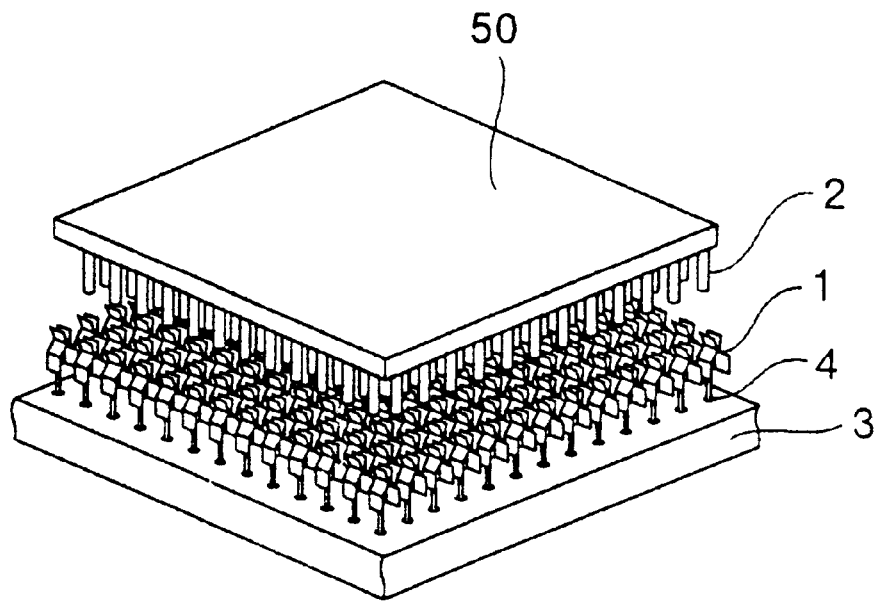
FIG. 1 is a perspective view of a multi-pin connector formed on a printed board according to an embodiment of the present invention.

Referring to FIG. 1, in the embodiment shown therein, a plurality of contact pins 1 are disposed in rows on a printed board 3, and they are soldered to each other to thereby form a multi-pin connector.

More specifically, a number of blind or bottomed connection holes 4, each of which has a diameter slightly larger than the contact pin 1, are first formed on an upper surface of the printed board 3 at a desired pitch, and solder paste is filled in each of the connection holes 4. Then, ends of the contact pins 1 are inserted into the connection holes 4 which are in desired positions, and thus, the contact pins 1 are arrayed in the desired form. In this state, the printed board 3 is heated to melt the solder paste, so that the contact pins 1 are fixedly soldered to the connection holes 4. As a result, the multi-pin connector of the embodiment is manufactured.

Figure 2:
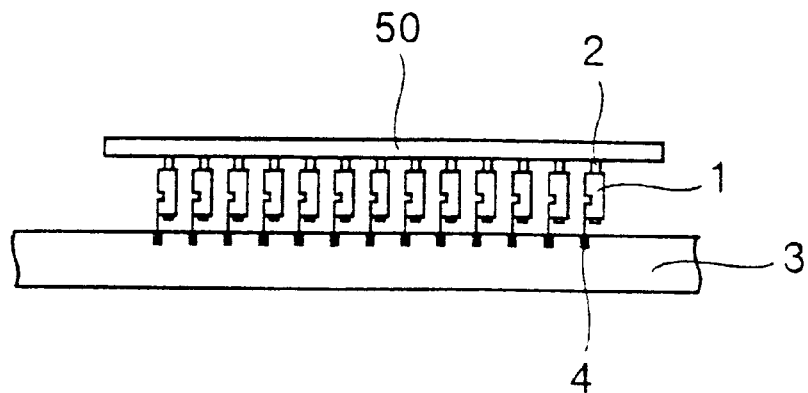
FIG. 2 is a view showing a state in which an LSI package is mounted onto the multi-pin connector shown in FIG. 1.

FIG. 2 shows a state in which an LSI package is mounted onto the multi-pin connector of the embodiment. Pins of a PGA LSI package 50, for example, are fitted to respective contact portions of the contact pins 1, and thereby the LSI package 50 is mounted on the printed board 3.

Another embodiment of the invention will be described.

Figure 3:
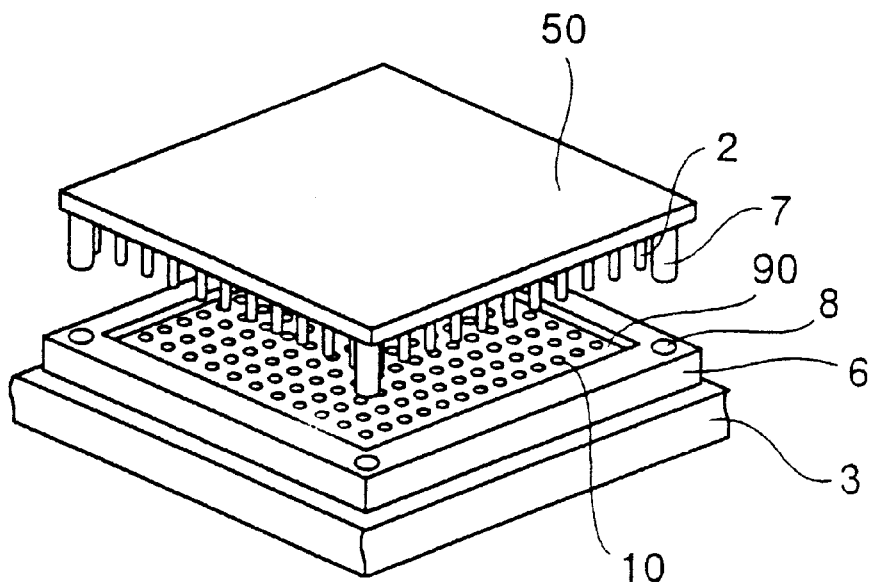
FIG. 3 is a perspective view of a multi-pin connector formed on a printed board according to another embodiment of the invention.
Figure 4:
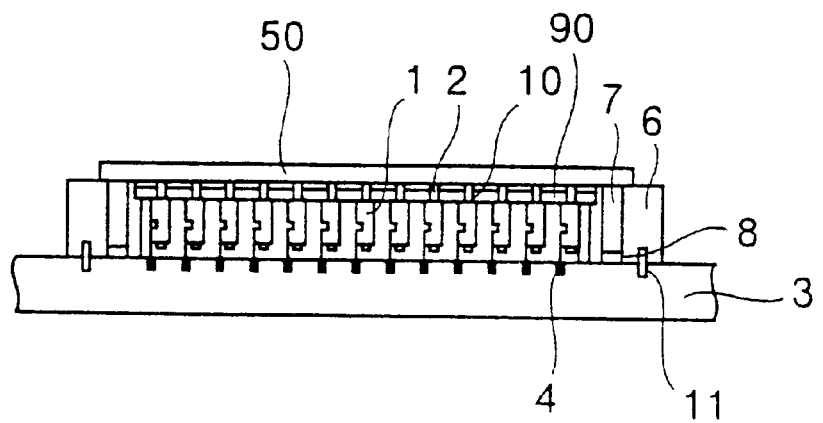
FIG. 4 is a view showing a state in which an LSI package is mounted onto the multi-pin connector shown in FIG. 3.

In FIG. 3, a guide frame 6 is provided on the outer periphery of the multi-pin connector shown in FIG. 1, and a protective cover 90 is provided over the multi-pin connector which is surrounded by the guide frame 6.

The guide frame 6 is formed in a generally square shape in the embodiment, to surround the multi-pin connector, disposed on the printed board, and is fixed in place by guide frame fixing pins 11. Further, guide pin insertion holes 8 are formed in predetermined positions, at every corner of the generally square shape in the embodiment, on the guide frame 6.

The guide frame 6 is preferably made of aluminum or a resin material such as glass epoxy which has some degree of rigidity, in view of easiness in fabricating the guide frame 6. Incidentally, the guide frame may be fabricated by any of various methods; e.g., by bonding four sides together and then forming the holes in the built-up sides, or by cutting a one-piece plate into the desired form.

On the other hand, the protective cover 90 is formed in a similar shape to the multi-pin connector to be fitted to the inside of the guide frame 6. The protective cover 90 is set above the multi-pin connector with its outer periphery held on a stepped portion which is formed along an inner periphery of the guide frame 6.

Further, formed in the protective cover 90 are a number of input/output pin insertion holes 10, each of which has a diameter larger than the input/output pin 2 of the LSI package 50, but smaller than the effective fitting width of the contact pin 1.

When mounting the LSI package 50 onto the multi-pin connector of the embodiment, guide pins 7 provided on the LSI package 50 are first inserted into the respective guide pin insertion holes 8 of the guide frame 6 for positioning between the multi-pin connector and the LSI package 50. Then, the input/output pins 2 are inserted into the respective contact portions of the contact pins 1 to thereby mount the LSI package 50 onto the multi-pin connector.

The multi-pin connector, which is provided with the guide frame 6 and the protective cover 90, is advantageous as follows. When mounting the LSI package as described above, the positioning between the package and the multi-pin connector can be made with the cooperation of the guide pin insertion holes 8 in the guide frame 6 and the guide pins 7 of the LSI package 50, thus enabling the package to be surely mounted onto the multi-pin connector. Moreover, the contact pins are protected from external force and dust by the protective cover 90 and, therefore, the reliability of the multi-pin connector is improved.

Figure 5:
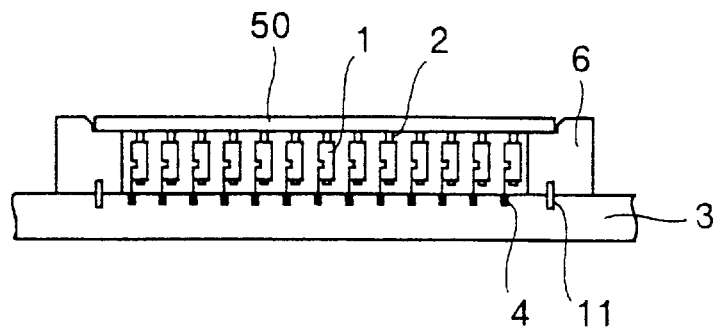
FIG. 5 is a view showing another structure of a guide frame for use with the multi-pin connector shown in FIG. 3.

As concerns the positioning mechanism of the guide frame 6, instead of providing the guide pin insertion holes in the predetermined positions as described above, an alternative may be made as shown in FIG. 5. Specifically, a part to be mounted and the multi-pin connector can be positioned relative to each other through an inner peripheral groove formed in an upper portion of the guide frame 6, which has substantially the same size as the part to be mounted, and by fitting the part to the guide frame 6 with side surfaces of the former engaged in the inner peripheral groove of the latter. Further, the above mechanism and the inner peripheral groove may be combined to perform the positioning.

An example of another structure for the protective cover of the embodiment will be described.

Figure 6:
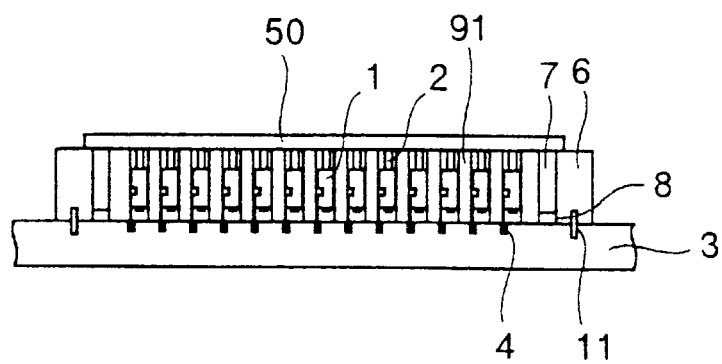
FIG. 6 is a view showing another structure of a protective cover for use with the multi-pin connector shown in FIG. 3.

In this example, as shown in FIG. 6, used as a protective cover 91 for the multi-pin connector is an insulating partition formed so as to surround the outer peripheries of the individual contact pins 1. More specifically, the protective cover 91 is made of an insulating material, has a thickness nearly equal to or larger than the height of the contact pins 1, and includes a number of through holes formed therein which each have a diameter larger than the contact pin 1. The protective cover 91 thus constructed is disposed on the printed board 3 in a position where the multi-pin connector is formed, such that the contact pins 1 are inserted into the respective through holes. According to the example, since the contact pins 1 are insulated from one another, such a defect as bending of some contact pin 1 will never adversely affect the adjacent pins and hence the contact pins are surely prevented from interfering with each other.

Although the relationship between the protective cover 91 and the guide frame 6 is not particularly described in the above example, the protective cover 91 and the guide frame 6 may be formed either separately or integrally. When they are formed in one united body, the guide pin insertion holes 8 are formed in the protective cover 91 at positions corresponding to an outer peripheral portion of the multi-pin connector. Then, in a similar manner as described above, the united body is placed on the printed board and fixed thereto by the guide frame fixing pins 11.

Alternatively, it is possible to use a contact pin arraying jig as it is, which will be described later, for the protective cover 91. Similar advantages as described above can be provided also in this case.

Still another embodiment of the invention will be described.

Figure 7:
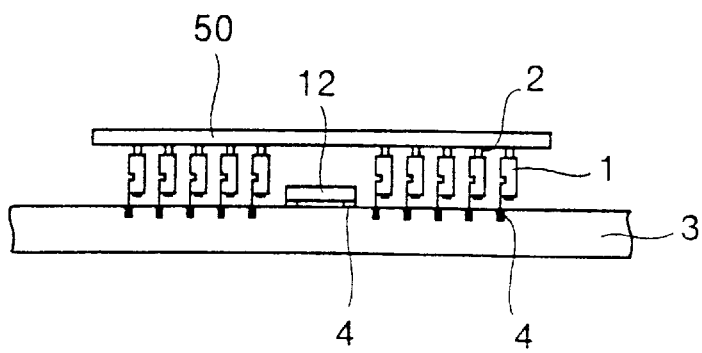
FIG. 7 is a perspective view of a multi-pin connector formed on a printed board according to still another embodiment of the invention.

In a multi-pin connector of this embodiment, as shown in FIG. 7, the contact pins 1 are not formed in part of a mounting area for the LSI package 50 on the printed board 3, and an electric part 12 such as a capacitor or a resistor is mounted there instead. With this structure, the electric part can be disposed near input/output pins to which it is to be connected, thereby improving electric performance of electronic devices and part mounting density on the printed board 3.

Examples of mounting of an MCM board and an LSI package will be described below, in which they are mounted in plural number on the printed board 3 by using the multi-pin connector of the invention described above.

Figure 8:
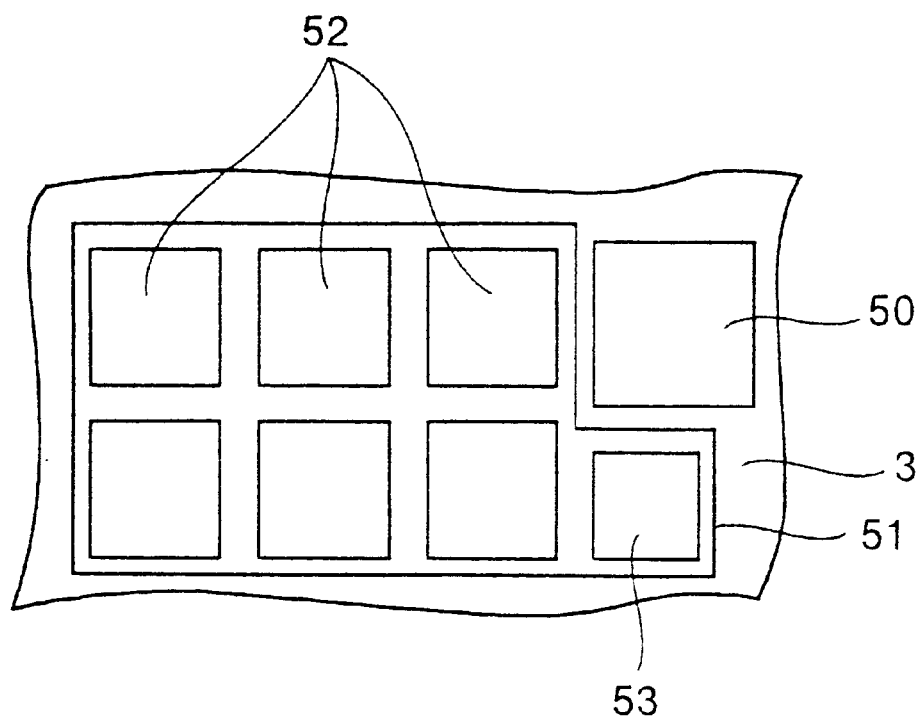
FIG. 8 is a view showing an example of mounting of an MCM board and an LSI package on a printed board.

FIG. 8 shows the example wherein an MCM board 51, on which a plurality of LSI packages 52 and an LSI package 53 of a different size from the LSI packages 52 have been mounted beforehand, is mounted on the printed board 3, and an additional LSI package 50 is also mounted on the printed board 3.

Figure 9:
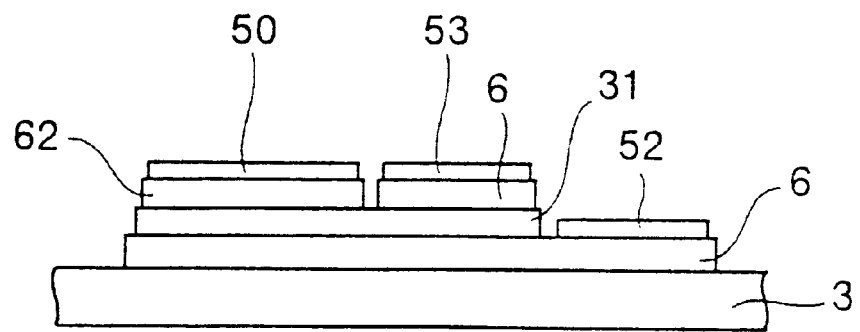
FIG. 9 is a view showing another example of mounting of an MCM board and an LSI package on a printed board.

FIG. 9 shows the example in which another printed board 31 and the LSI package 52 are mounted on the printed board 3 through a multi-pin connector, and the other LSI packages 50, 53 are mounted on the printed board 31 through another multi-pin connector.

According to the present invention, since a multi-pin connector is fabricated by arranging and fixing a number of contact pins directly onto a printed board in desired positions, the multi-pin connector having any desired form can be manufactured. Therefore, even when electronic devices are constructed in various combinations of a printed board, an MCM board and an LSI package, as shown in FIGS. 8 and 9, the multi-pin connector can be fabricated with ease in a short period of time as per the idea conceived by the designer, resulting in remarkable reduction of the time period for development of connectors. Further, since printed boards can be easily laminated, it is also possible to provide an electronic device which has the remarkably improved density of parts mounted on the printed boards.

An embodiment of manufacturing steps for the multi-pin connector of the present invention mentioned above will be described in detail with reference to FIGS. 10A to 10D.

First, a plurality of blind or bottomed connection holes 4, each having a diameter larger than the contact pin 1, are formed on the upper surface of the printed board 3 at a desired pitch, and solder paste is filled in each of the connection holes 4.

Figure 10A:
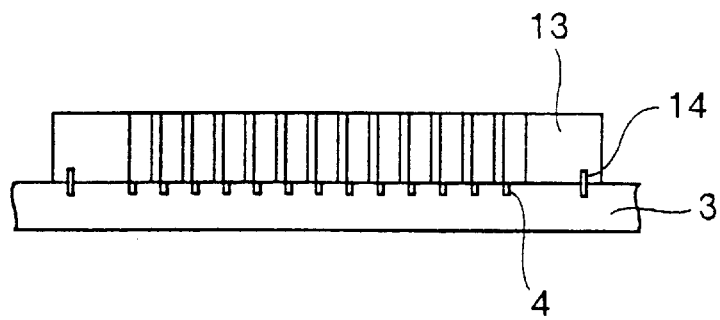
FIGS. 10A to 10D are views showing manufacturing steps of a multi-pin connector according to the present invention.

Then, as shown in FIG. 10A, a contact pin arraying jig 13 is disposed on the printed board 3 and secured in place by fixing pins 14.

Figure 10B:
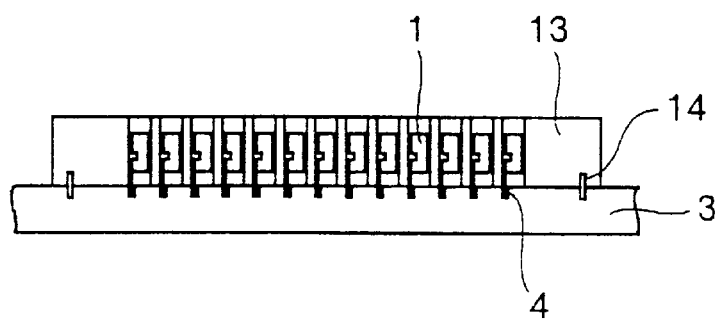

The contact pins 1 are loaded into the contact pin arraying jig 13 so that ends of the contact pins 1 are inserted to the connection holes 4 to be arrayed in rows, as shown in FIG. 10B.

In this state, by effecting solder flow, the contact pins 1 are fixedly soldered to the connection holes 4, and then, the contact pin arraying jig 13 is removed.

The contact pin arraying jig used in the embodiment is formed of an insulating member which has a thickness larger than the height of the contact pins 1 and is provided with a plurality of through holes each having a diameter larger than the contact pin 1, as with the aforementioned protective cover 91. Alternatively, the contact pin arraying jig may comprise a similar insulating member which is provided, at positions where the contact pins are to be arranged, with a plurality of through slots for the respective rows of the contact pins. In this case, a chain of contact pins wound on a reel beforehand is cut in every predetermined length, and the pieces thus cut are loaded into the through slots of the arraying jig. This enables the contact pins to be arranged and connected at one time, which will be detailed later.

Figure 10C:
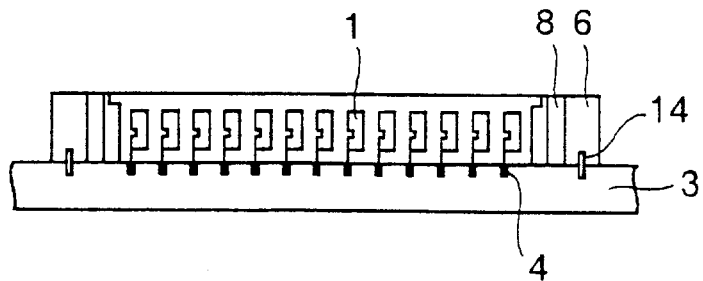

Subsequently, as shown in FIG. 10C, the guide frame 6 is fitted to the fixing pins 14 to be placed around the area of the printed board 3 in which the contact pins are provided.

Figure 10D:
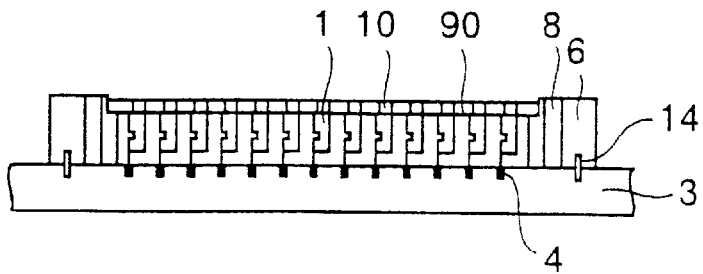

Then, the protective cover 90 is fitted to the stepped portion formed along the inner periphery of the guide frame 6 so that the protective cover 90 is set above the multi-pin connector, as shown in FIG. 10D. Through the foregoing steps, the multi-pin connector of the invention is fabricated.

Although the arraying jig is removed after the solder reflow in this embodiment, it may be left as it is to serve as the protective cover 91 and the guide frame 6 in the embodiment of FIG. 6.

Figure 11A:
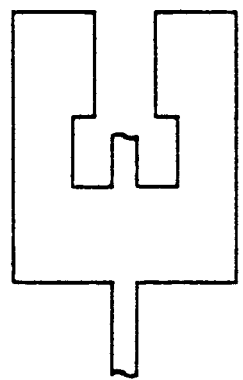
FIGS. 11A and 11B are views showing an example of a box-shaped contact pin for use in the present invention.
Figure 11B:
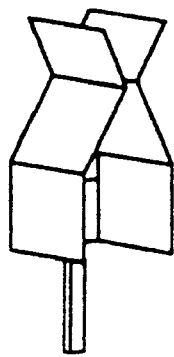

FIGS. 11A and 11B show a box-shaped contact pin for use in the present invention, which is formed by pressing and bending a thin plate.

Figure 12:
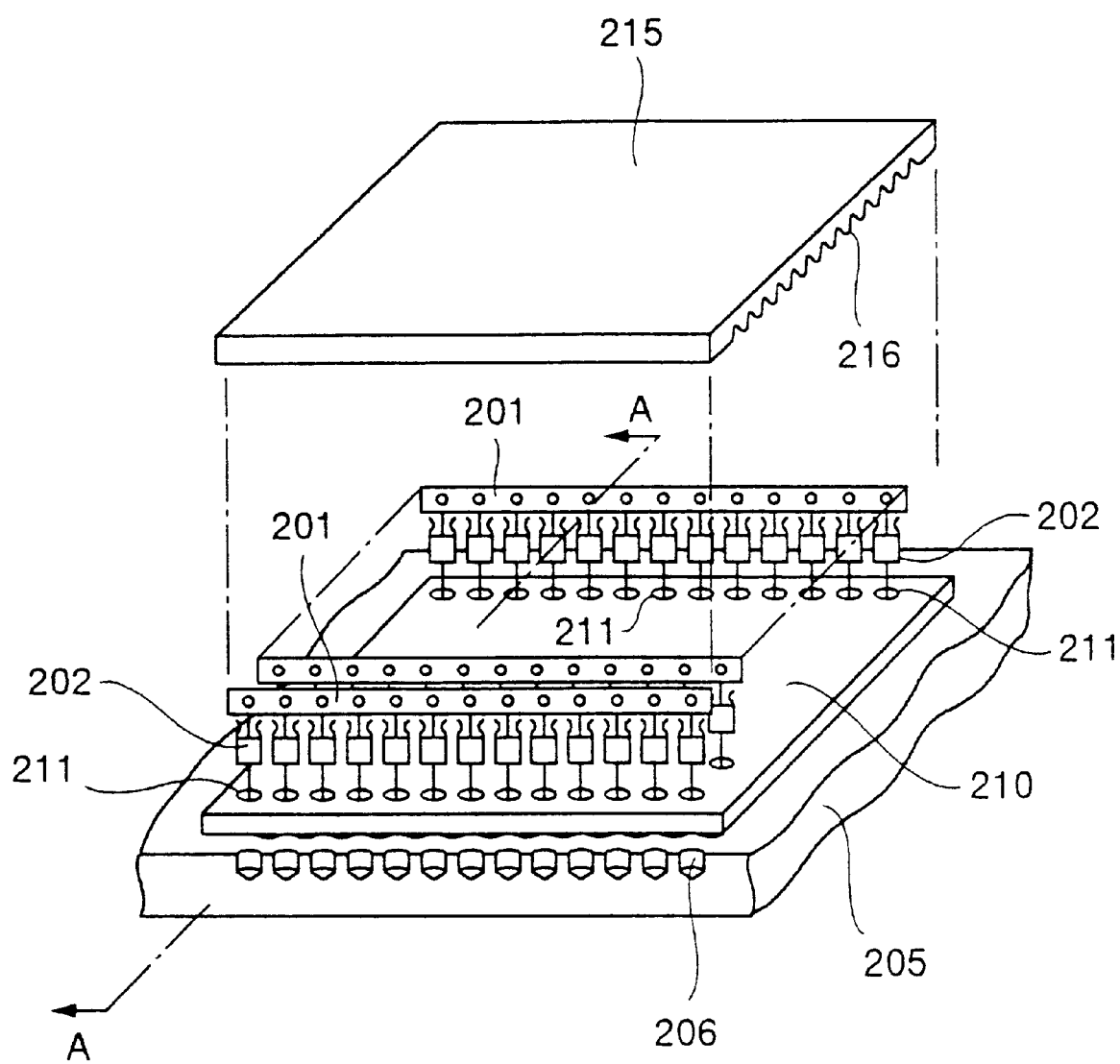
FIG. 12 is an exploded perspective view showing the relationship between constituent members for use in the present invention.

A method of installing a chain of contact pin parts, which comprises a number of contact pin parts and a connection member connecting them in a line according to the present invention will be now described. FIG. 12 shows a case where a number of chains of contact pin parts 201 are arranged in connection holes 206 formed in an electronic circuit board 205. An arraying jig 210 is disposed above the electronic circuit board 205. The arraying jig 210 has a pattern corresponding to the connection holes 206 of the electronic circuit board 205, which pattern is formed by through holes for insertion and positioning of the contact pin parts. Further, disposed on the chains of contact pin parts 201 thus positioned through the arraying jig 210 is a grooved jig 215 which serves as means for pressing the chains of contact pin parts toward the electronic circuit board. The relationship of the electronic circuit board 205, the arraying jig 210 and the grooved jig 215 in FIG. 12 is shown in FIG. 13 which is a sectional view taken along line A—A in FIG. 12.

Figure 13:
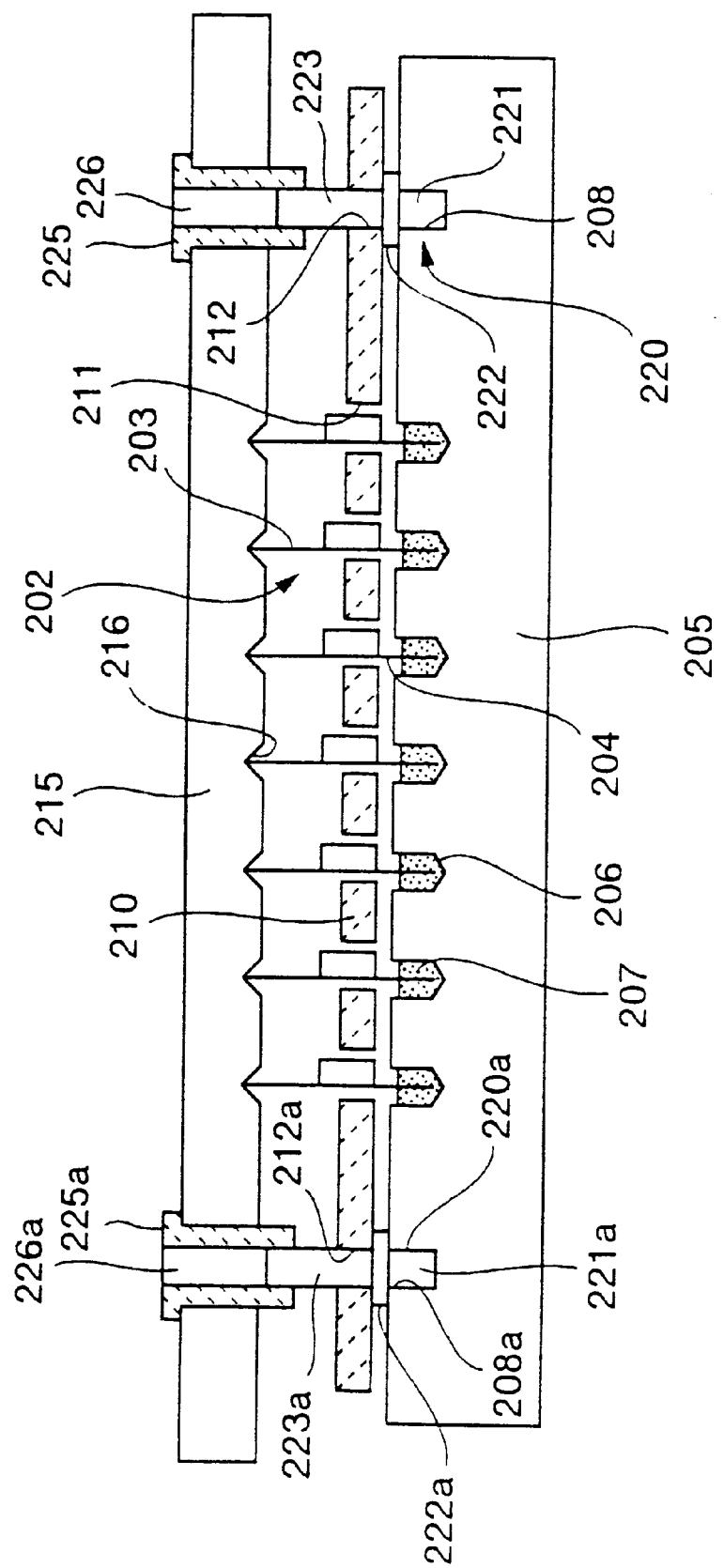
FIG. 13 is a sectional view taken along line A—A in FIG. 12.

In the embodiment shown in FIGS. 12 and 13, a number of connection holes 206 defining a circuit pattern are formed in plural rows in a surface portion of the electronic circuit board 205, and solder paste 207 is filled in the connection holes by means of a solder paste printing machine or the like. Further, the arraying jig 210 disposed above the electronic circuit board 205 has plural rows of insertion holes 211 formed for insertion of the contact pin parts and holding them in accordance with the connection holes 206 in the electronic circuit board 205. The insertion holes 211 in the arraying jig 210 may be circular, rectangular, etc. in cross-section. Furthermore, the insertion holes formed in plural rows may all have the same shape, or may be sized such that some insertion holes corresponding to both ends and the center of the chains of contact pin parts have a small diameter and the remaining insertion holes have a large diameter.

The arraying jig 210 can be formed of one of a metal material such as iron, stainless steel, aluminum and copper, an organic (plastic) material of heat resistance such as polyimide and glass epoxy, and another material such as glass and ceramic. The grooved jig 215 disposed above the arraying jig 210 for pressing the positioned chains of contact pin parts toward the electronic circuit board 205 can be formed of any heat-resistant material. In view of pressing the chains of contact pin parts toward the electronic circuit board, the grooved jig may be formed of any heavy metal material such as iron and copper. Alternatively, the grooved jig may be formed of the same material as the arraying jig. A number of grooves 216 are formed in a lower surface of the grooved jig 215 corresponding to the connection holes 206 of the electronic circuit board 205. The grooved jig 215 presses and holds the chains of contact pin parts 201 with top ends of upper pins 203 or the connection members of the parts 201 engaged in the respective grooves 216.

Means for effecting mutual positioning of component parts are provided in order to arrange the chains of contact pin parts 201 through the arraying jig 210 in accordance with the connection holes 206 in the electronic circuit board 205 and to press the chains of contact pin parts from above by the grooved jig 215 to position them as described above. Used as the means for effecting positioning are positioning pin members 220 as shown in FIG. 13. Each positioning pin member 220 comprises a base portion 221 to be located downward, a flange portion 222 of a larger diameter, and an upper portion 223 projecting upwardly. The base portions 221 of the positioning pin members 220 are inserted in respective base holes 208 formed in ends of the electronic circuit board 205. Then, the arraying jig 210 is placed on the flange portions 222 to provide a clearance between the electronic circuit board 205 and the arraying jig 210 in accordance with the thickness of the flange portions 222. Specifically, the arraying jig 210 is provided with side holes 212 each of which has a diameter for insertion of the upper portion 223 of the positioning pin member. The arraying jig 210 is positioned relatively to the electronic circuit board 205 with the upper portions 223 of the pin members penetrating through the side holes 212. Furthermore, the top ends of the upper portions 223 are inserted into insertion holes 226 of guide members 225 provided on the grooved jig 215. Thus, the positioning pin members 220 serve as the means for positioning the component members relative to one another.

The means for positioning the electronic circuit board 205, the arraying jig 210 and the grooved jig 215, i.e., the positioning pin members 220, may be located in predetermined positions on both sides of the electronic circuit board in the direction of width thereof. In the present embodiment, the positioning pin members 220, 220a are disposed in the laterally opposite ends of the electronic circuit board 205 for positioning the component members relative to one another. In the case of providing the means for effecting positioning at four corners of the electronic circuit board, the positioning pin members are vertically planted at the four corners of the electronic circuit board. The side holes and the guide members are provided respectively in the arraying jig 210 and the grooved jig 215 in positions corresponding to the positioning pin members.

Further, in the component member positioning means comprising the positioning pin members, the precision of the pin members and the insertion holes is set so as to enable the connection holes formed in the electronic circuit board, the insertion holes formed in the arraying jig, and the grooves formed in the grooved jig to be positioned relative to one another with predetermined accuracy, so that the chains of contact pin parts can be precisely positioned. Incidentally, to effect proper positioning of the electronic circuit board, the arraying jig and the grooved jig relative to each other, the shape and the number of the positioning pin members, means for holding clearances between the component members, etc. can be adequately set.

When a very large number of chained contact pin parts are to be assembled onto the electronic circuit board by means of the positioning members constructed as above for the chains of contact pin parts, solder paste is printed in accordance with the connection holes 206 of the electronic circuit board 205. Then, the arraying jig 210 having the insertion holes 211 formed in accordance with the connection holes 206 of the electronic circuit board 205 is positioned in place with the aid of the positioning pin members 220. After that, the chains of contact pin parts 201 are inserted through the insertion holes 211 in accordance with the circuit pattern so that the chains of contact pin parts are arrayed in plural rows to completely fill up the connection holes of the electronic circuit board. In this state, the grooved jig 215 is set from above of the chains of contact pin parts 201 with the aid of the positioning pin members to position and press the chains of contact pin parts 201 while the top ends of the chained parts 201 are engaged in the grooves of the grooved jig 215. The chains of contact pin parts 201 are thereby temporarily fixed to the electronic circuit board 205, and the temporary positioning and holding thereof is thus completed. Subsequently, while keeping the electronic circuit board 205, the arraying jig 210 and the grooved jig 215 as one unit body, they are heated by means of a reflow furnace or the like, causing the solder paste to be melted and then solidified. As a result, lower pins 204 of the contact pin parts are fixedly connected to the electronic circuit board 205 through the solder.

Figure 14:
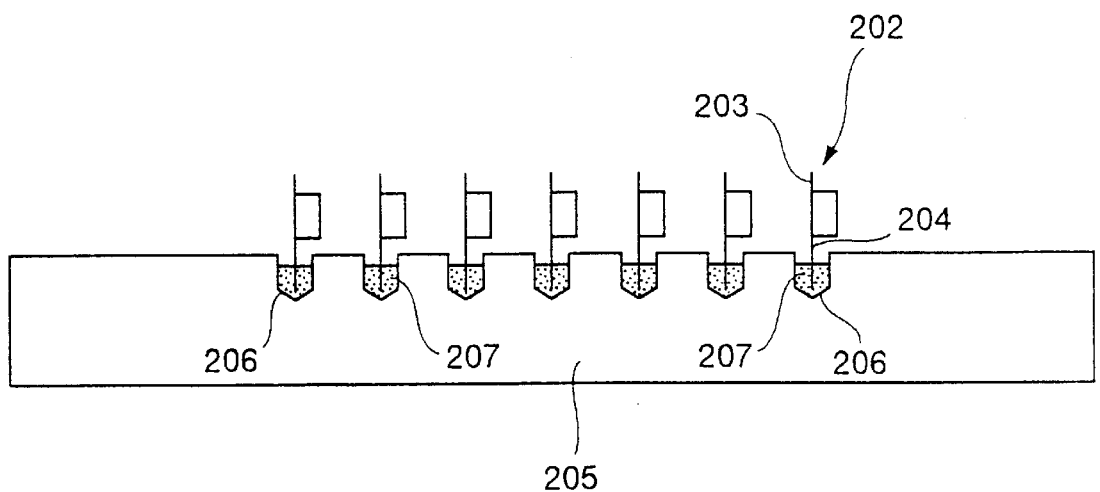
FIG. 14 is an explanatory view showing a state in which contact pin parts are attached to an electronic circuit board.

During the above step of soldering, the chains of contact pin parts are pressed under a predetermined pressure by the grooved jig 215. Therefore, when the solder paste is melted by heating, the lower pins of the contact pin parts are fully inserted and fixed in the connection holes which define the circuit pattern on the electronic circuit board. After fixing the chains of contact pin parts to the electronic circuit board as described above, the grooved jig 215 is removed, and the upper pins 203 of the contact pin parts 201 are cut off with the respective connection members which have connected the parts 201 into the chains so that the remaining upper pins 203 of the contact pin parts 201 are projected upwardly of the arraying jig 210. After that, the arraying jig 210 and the positioning pin members 220 are removed. Consequently, as shown in FIG. 14, the electronic circuit board 205, in which the lower pins 204 of the many contact pin parts 201 are fixedly held on the board surface so as to form the circuit pattern, can be thus provided. In the electronic circuit board 205 shown in FIG. 14, a large number of contact pin parts are positioned and arrayed in accordance with the connection holes in a state that the lower pins 204 of the contact pin parts 201 are fixed in the predetermined positions by the solder and the upper pins 203 thereof are projecting above the board surface with a predetermined height.

Figure 15:
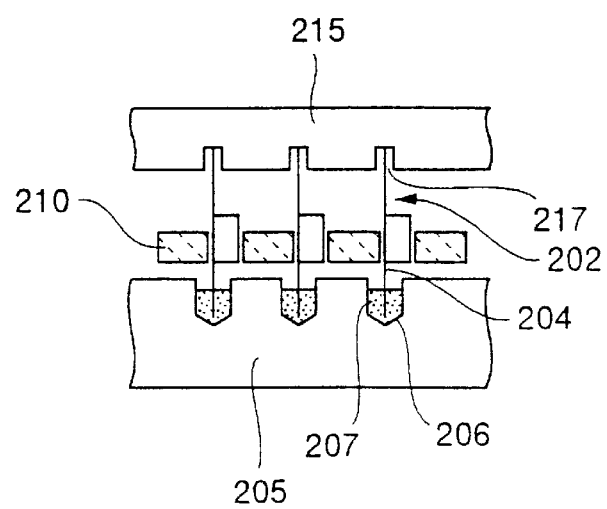
FIG. 15 is an explanatory view showing another embodiment of grooves arranged in a groove jig.
Figure 16:
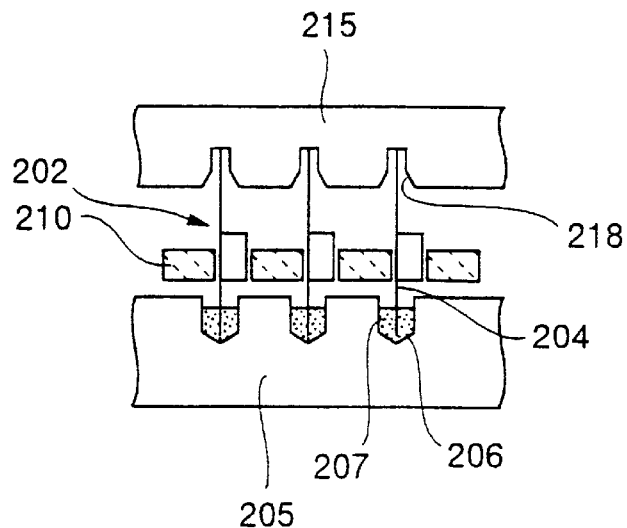
FIG. 16 is an explanatory view showing still another embodiment of grooves arranged in a groove jig.
Figure 17:
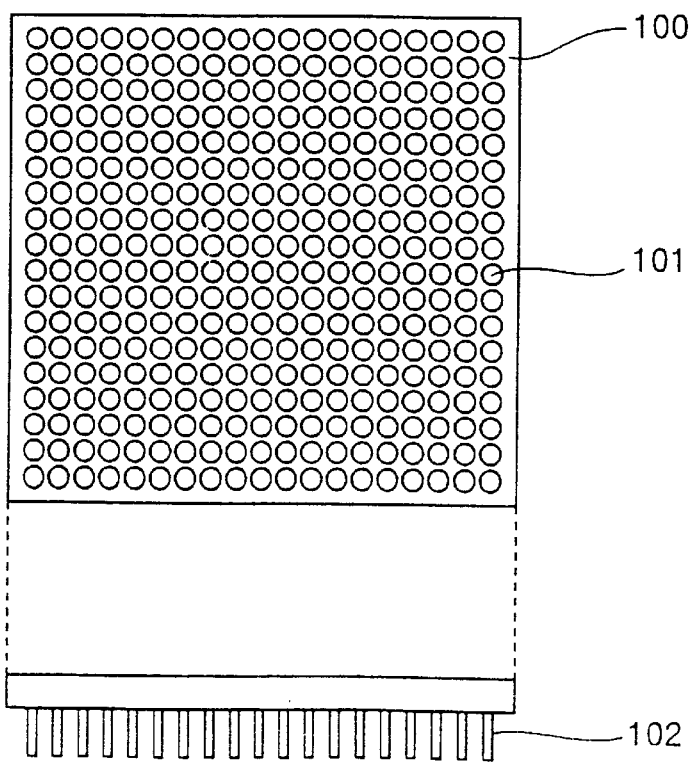
FIG. 17 is a view showing a multi-pin connector of the prior art.

The grooves in the grooved jig 215, which is used for pressing the chains of contact pin parts from above in the course of arranging and positioning them on the electronic circuit board 205 through the arraying jig 210, may be formed in such a sectional shape as shown in FIG. 15 or 16 other than a V-shape as shown in FIG. 13. FIG. 15 shows the case where slit-like grooves 217 of a rectangular cross-section are formed in the lower surface of the grooved jig 215, and FIG. 16 shows the case where slit-like grooves 218 spreading downwardly are formed in the lower surface of the grooved jig 215. The grooved jig having the grooves shaped to make the contact pin parts more easily fit in place is advantageous in that when the chained upper portions of the contact pin parts are engaged in the grooves as shown in FIGS. 13, 15 and 16, it is possible to easily insert a large number of chained contact pin parts to the grooves for positioning, fixing and holding the chains of contact pin parts in accordance with the connection holes.

What is claimed is:

1. A multi-pin connector for mounting other boards or electronic parts on a main board, comprising:

a plurality of bottomed, contact pin connection holes formed in a predetermined area of a surface of the main board, the contact pin connection holes having completely enclosed bottoms and containing solder therein; and a plurality of contact pins each having contact portions and pin portions, the contact pin being disposed in an array and secured to the main board separately from each other, with the pin portions soldered to the respective connection holes so as to be self-standing on the main board without a housing, and with the contact portions being free for connection to the other boards or electronic parts.

2. A multi-pin connector according to claim 1, wherein the pin portion of each of the contact pins does not extend through the bottom of a corresponding contact pin connection hole.

3. A multi-pin connector according to claim 1, further comprising a guide frame formed around the predetermined area of the main board for improving fitting accuracy between terminals of the other boards or electronic parts and the contact pins.

4. A multi-pin connector according to claim 3, further comprising a protective member supported by the guide frame to be disposed over the contact pins for protection of the contact pins, the protective member having a plurality of holes formed therein for insertion of the terminals of the other boards or electronic parts.

5. A multi-pin connector according to claim 4, wherein the protective member has a thickness equal to or greater than a height of the contact pins, the holes of the protective member penetrate completely through the protective member, and the protective member is placed with the contact pins inserted into the respective holes of the protective member.

6. A multi-pin connector according to claim 4, wherein the guide frame and the protective member are formed as one body.

7. An electronic device comprising:
   a first board having a plurality of bottomed, first connection holes formed in a surface thereof, the first connection holes having completely enclosed bottoms and containing solder therein;
   a plurality of first contact pins each having contact portions and pin portions, the first contact pins being disposed in an array and secured to the first board separately from each other, with the pin portions soldered to the respective connection holes so as to be self-standing on the first board without a housing, and with the contact portions being free for connection to other boards or electronic parts; and
   at least one first electronic part having a plurality of terminal pins on a surface thereof, the at least one first electronic part being mounted on the first board with the terminal pins fitted to the respective contact portions of the first contact pins and supported by the first contact pins.

8. An electronic device according to claim 7, wherein the first board has a plurality of electronic part mounting areas on the surface where the first contact pins are secured, a first one of the at least one first electronic part being mounted to one of the electronic part mounting areas and a second one of the at least one first electronic part being mounted to another of the electronic part mounting areas.

9. An electronic device according to claim 7, wherein the at least one first electronic part has an opposite surface to the surface where the terminal pins exist, the electronic device further comprising at least one other electronic part different from the at least one first electronic part and mounted on the opposite surface of the at least one first electronic part.

10. An electronic device according to claim 7, further comprising:
    a second board having a plurality of terminal pins on a surface thereof, the second board being mounted on the first board with the terminal pins of the second board fitted to the respective contact portions of the first contact pins and supported by the first contact pins, the second board having a plurality of bottomed, second connection holes in an opposite surface thereof to the surface where the terminal pins of the second board exist, the second connection holes having completely enclosed bottoms and containing solder therein;
    a plurality of second contact pins each having contact portions and pin portions, the second contact pins being disposed in an array and secured to the second board separately from each other, with the pin portions of the second contact pins soldered to the respective second connection holes so as to be self-standing on the second board without a housing, and with the contact portions of the second contact pins being free for connection to the other boards or electronic parts; and
    at least one second electronic part having a plurality of terminal pins on a surface thereof, the at least one second electronic part being mounted on the second board, with the terminal pins of the at least one second electronic part fitted to the respective contact portions of the second contact pins and supported by the second contact pins.

11. An electronic device comprising:
    a main board having on a surface thereof a plurality of bottomed connection holes formed in a first area of the surface and a second area without connection holes, the connection holes having completely enclosed bottoms and containing solder therein;
    a plurality of contact pins each having contact portions and pin portions, the contact pins being disposed in an array and secured to the first area of the main board separately from each other, with the pin portions soldered to the respective connection holes so as to be self-standing on the main board without a housing, and with the contact portions being free for connection to other boards or electronic parts;
    at least one first electronic part having a plurality of terminal pins on a surface thereof, the at least one first electronic part being mounted to the first area of the main board with the terminal pins fitted to the respective contact portions of the contact pins and supported by the contact pins; and
    at least one second electronic part directly mounted to the second area of the main board.

12. An electronic device according to claim 11, wherein the first area is disposed around the second area, and the at least one first electronic part is positioned above the at least one second electronic part.

* * * * *